US010920321B2

(12) United States Patent
Hyman et al.

(10) Patent No.: US 10,920,321 B2
(45) Date of Patent: Feb. 16, 2021

(54) CHROME-FREE ADHESION PRE-TREATMENT FOR PLASTICS

(71) Applicants: UAB REKIN INTERNATIONAL, Vilnius (LT); Mark Hyman, Oxnard, CA (US); STATE RESEARCH INSTITUTE CENTER FOR PHYSICAL SCIENCES AND TECHNOLOGY, Vilnius (LT)

(72) Inventors: Mark Hyman, Agoura Hills, CA (US); Leonas Naruškevičius, Vilnius (LT); Danas Budilovskis, Vilnius (LT)

(73) Assignees: UAB REKIN INTERNATIONAL, Vilnius (LT); STATE RESEARCH INSTITUTE CENTER FOR PHYSICAL SCIENCES AND TECHNOLOGY, Vilnius (LT); Mark Hyman, Oxnard, CA (US)

( * ) Notice: Subject to any disclaimer, the term of this patent is extended or adjusted under 35 U.S.C. 154(b) by 556 days.

(21) Appl. No.: 15/310,740

(22) PCT Filed: May 30, 2014

(86) PCT No.: PCT/US2014/040216
§ 371 (c)(1),
(2) Date: Nov. 11, 2016

(87) PCT Pub. No.: WO2015/183304
PCT Pub. Date: Dec. 3, 2015

(65) Prior Publication Data
US 2017/0073816 A1  Mar. 16, 2017

(51) Int. Cl.
| C23C 14/02 | (2006.01) |
| C23C 18/20 | (2006.01) |
| C25D 5/56 | (2006.01) |
| C23C 16/02 | (2006.01) |
| C23C 18/24 | (2006.01) |
| C23C 4/12 | (2016.01) |
| C23C 14/20 | (2006.01) |
| C23C 14/34 | (2006.01) |
| C23C 18/16 | (2006.01) |

(52) U.S. Cl.
CPC ............ C23C 18/2086 (2013.01); C23C 4/12 (2013.01); C23C 14/021 (2013.01); C23C 14/205 (2013.01); C23C 14/34 (2013.01); C23C 16/0227 (2013.01); C23C 18/1687 (2013.01); C23C 18/24 (2013.01); C25D 5/56 (2013.01)

(58) Field of Classification Search
CPC ......... C23C 18/22; C23C 18/24; C23C 14/02; C23C 16/0227
See application file for complete search history.

(56) References Cited

U.S. PATENT DOCUMENTS

| 3,099,608 A | 7/1963 | Radovsky et al. |
| 4,004,051 A | 1/1977 | Kadison et al. |
| 4,231,847 A | 11/1980 | Lui |
| 4,631,117 A | 12/1986 | Minten et al. |
| 4,652,311 A | 3/1987 | Gulla et al. |
| 4,790,913 A | 12/1988 | Higuchi et al. |
| 4,834,910 A | 5/1989 | Fujii et al. |
| 4,874,477 A | 10/1989 | Pendleton |
| 4,891,069 A | 1/1990 | Holtzman et al. |
| 4,895,739 A | 1/1990 | Bladon |
| 4,952,286 A | 8/1990 | Bladon et al. |
| 4,959,121 A * | 9/1990 | Dumas .............. C08G 73/1003 205/164 |
| 5,007,990 A | 4/1991 | Bladon |
| 5,160,600 A * | 11/1992 | Patel ...................... C23C 18/24 205/167 |
| 5,183,552 A | 2/1993 | Bressel et al. |
| 5,212,138 A | 5/1993 | Krulik et al. |
| 5,268,024 A | 12/1993 | Moran |
| 5,269,973 A | 12/1993 | Takahashi et al. |
| 5,352,266 A | 10/1994 | Erb et al. |

(Continued)

FOREIGN PATENT DOCUMENTS

| WO | 2000/29646 A1 | 5/2000 |
| WO | 2008/132926 A1 | 11/2008 |
| WO | 2013/182590 A1 | 12/2013 |

OTHER PUBLICATIONS

WIPO, International Preliminary Report on Patentability from corresponding International Application PCT/US2014/040216, dated Dec. 6, 2016.

*Primary Examiner* — Tabassom Tadayyon Eslami
(74) *Attorney, Agent, or Firm* — Foley & Lardner LLP

(57) ABSTRACT

Provided are chrome-free adhesion pretreatment processes for use on a variety of reinforced or unreinforced plastics and polymers, such as polyimides, polyetherimides and polyvinylchloride. The pretreatment process can be performed in a combination of two sequential operations, which includes treating with a first solution containing nitric acid and subsequently treating with a second solution that includes sulfuric acid and periodate ions. Alternatively, the pretreatment process can be performed by treatment with a single combined composition that includes nitric acid, sulfuric acid, and periodate ions. The pretreatment processes, either done in two separate solutions, sequentially, or in one combined solution, produce an adherent surface for further metallization of the article, with adhesional values of the metal layer higher than those achieved using conventional chromic acid pretreatment processes.

18 Claims, No Drawings

(56) References Cited

U.S. PATENT DOCUMENTS

| | | | |
|---|---|---|---|
| 5,415,762 | A | 5/1995 | Allardyce et al. |
| 5,476,580 | A | 12/1995 | Thorn et al. |
| 5,500,106 | A | 3/1996 | Goldberg |
| 5,500,315 | A | 3/1996 | Calvert et al. |
| 5,776,587 | A | 7/1998 | Angelopoulos et al. |
| 5,830,805 | A | 11/1998 | Shacham-Diamand et al. |
| 6,039,859 | A | 3/2000 | Sonnenberg et al. |
| 6,149,840 | A | 11/2000 | Ardakani et al. |
| 6,290,832 | B1 | 9/2001 | Bugnet et al. |
| 6,325,910 | B1 | 12/2001 | Meyer et al. |
| 6,331,239 | B1 | 12/2001 | Shirota et al. |
| 6,589,593 | B1 | 7/2003 | Hupe et al. |
| 6,712,948 | B1 | 3/2004 | Naruskevicius et al. |
| 6,743,501 | B2 | 6/2004 | Bugnet et al. |
| 6,984,446 | B2 | 1/2006 | Gundlach et al. |
| 7,147,896 | B2 | 12/2006 | Rine |
| 7,320,832 | B2 | 1/2008 | Palumbo et al. |
| 7,347,924 | B1 | 3/2008 | Yoon |
| 7,744,685 | B2 | 6/2010 | Lancsek et al. |
| 7,780,771 | B2 | 8/2010 | Scaraglino et al. |
| 8,197,583 | B2 | 6/2012 | Hotta et al. |
| 8,293,648 | B2 | 10/2012 | Futase et al. |
| 8,309,164 | B2 | 11/2012 | Imai et al. |
| 8,366,901 | B2 | 2/2013 | Lachowicz et al. |
| 8,394,473 | B2 | 3/2013 | McCrea et al. |
| 8,580,100 | B2 | 11/2013 | Feng et al. |
| 2008/0232024 | A1 | 9/2008 | Yang et al. |
| 2010/0170626 | A1* | 7/2010 | Lochtman ............... B05D 1/00 156/150 |
| 2013/0084395 | A1 | 4/2013 | Chapaneri et al. |

\* cited by examiner

CHROME-FREE ADHESION PRE-TREATMENT FOR PLASTICS

TECHNICAL FIELD

This invention relates to new adhesion pretreatment methods that considerably enhance the adhesion of either electrolessly (i.e. autocatalytic) plated, directly electroplated, or plated by other techniques metal coatings to a non-conductive substrate, particularly to a substrate comprising a plastic or polymer, the method free of chromium ions, making the method more environmentally friendly. The inventions also relates to articles metallized after using the adhesion pretreatment methods.

BACKGROUND

Metallizing, or coating or plating a nonconductive substrate with a continuous metal coating or patterned or discontinuous metal coating or plating has been employed in a number of industries and applications for many years. Many methods are known for applying a metal coating to polymer parts. Such methods are described, e.g., in U.S. Pat. No. 4,231,847 (1980), U.S. Pat. No. 4,959,121 (1990), U.S. Pat. No. 5,352,266 (1994), U.S. Pat. No. 7,3230,832 (2008), U.S. Pat. No. 8,293,648 (2012), U.S. Pat. No. 8,394,473 (2013) and U.S. Pat. Appl. Pub. No. US20130084395. An exemplary metallizing process is described in U.S. Pat. No. 4,959,121 (1990). In this patent, the plastic is a polyimide and the adhesional pretreatment includes treatment in concentrated nitric acid at room temperature, then continuing the pre-treatment in concentrated sulfuric acid, followed by dipping the polyimide into a strongly alkaline solution of sodium hydroxide and finalizing the pre-treatment by contacting the polyimide with an alkaline permanganate solution. In the methods described in U.S. Pat. No. 4,959,121, there are several successive pretreatment steps and washing steps required to provide an active surface that can be metallized. A need exists for a pretreatment method that reduces the number of pretreatment steps necessary to provide an adherent surface of a substrate to be metallized.

Many of the pretreatment methods for preparing an adherent surface for metallizing include treatment with chromosulfuric (chromic, $CrO_3$) acid. Chromic acid presents toxicity and waste disposal problems, and is considered to be an environmental hazard in some countries. Thus, a need exists for a method preparing an adherent surface for metallizing that does not require the use of chromic acid.

SUMMARY

Provided are methods of pretreating a surface of an article, particularly a plastic article, to produce an adherent surface for metallizing, in which the methods do not require the use of chromic acid. In some applications, the process includes no chromium ions. Provided are chrome-free adhesion pretreatments for use on a variety of plastics and polymers. A particular plastic substrate includes a plastic having a glass transition temperature ($T_g$) of 155° C. or greater. Examples of such plastics and polymers are polyimides, specifically glass reinforced or unreinforced polyetherimides. The methods provided herein also can be used as a pretreatment of surfaces of a substrate containing a plastic having a low $T_g$ resins, such as a $T_g$ value that is below 155° C., for example, polyvinylchloride.

In one application of the chrome-free adhesion pretreatment, the pretreatment includes two sequential operations executed in two separate solutions. The first solution is concentrated nitric acid (from at or about 7.9 moles/L (M/L) to at or about 13 M/L). The subsequent second solution includes concentrated sulfuric acid (at least 15.4 M/L) containing periodate ions (at least 0.01 M/L sodium periodate).

In another application of the chrome-free adhesion pretreatment, the pretreatment is executed in a single combined composition. The single combined composition is a mixture that includes nitric acid (from about 0.013 M/L to about 0.130 M/L), sulfuric acid (from about 15.4 M/L to about 17.5 M/L) and periodate ions in an amount greater than 0.01 M/L. The processes provided herein are free of chromium ions.

While not wishing to be bound by any particular theory, it is believed that the oxidative acids, particularly the nitric acid or sulfuric acid or the combination of sulfuric and nitric acids, modify the surface of the plastic or polymer, and the periodate ions further react with the modified surface of the plastic or polymer, creating functional groups of very high adhesional bond. This results in unusually high adhesion of subsequently plated metallic coatings.

Provided are chrome-free adhesion pretreatment methods that include as steps contacting a surface of the substrate with one of the one-step or the two-step chromium-free adhesional pretreatment processes provided herein. In the two-step process, the surface of the substrate is contacted with a first composition containing at least 7.9 Moles/L (M/L) nitric acid, followed by treatment with a second composition containing at least 15.4 M/L sulfuric acid and periodate ions in an amount greater than 0.01 M/L to produce an adherent surface. In the one-step process, the surface of the substrate is contacted with an combined composition containing from about 0.013 M/L to about 0.130 M/L nitric acid, from about 15.4 M/L to about 17.5 M/L sulfuric acid, and periodate ions in an amount greater than 0.01 M/L to produce an adherent surface. The surface of the substrate can be an inner surface or an outer surface or a combination thereof.

The concentration of the nitric acid in the first composition can be in the range of at or about 7.9 M/L to at or about 13.0 M/L. In some applications, the nitric acid in the first composition is present at a concentration of at or about 13.0 M/L. The sulfuric acid in the second composition or the combined composition can be in the range of at or about 15.4 M/L to at or about 16.9 M/L. In some applications, the concentration of sulfuric acid in the second composition or the combined composition is at or about 16.9 M/L.

The concentration of periodate ions in the second composition or the combined composition can be greater than about 0.01 M/L, or greater than about 0.1 M/L. In some applications, the concentration of periodate ions in the second composition is at or about 0.2 M/L and in the combined composition is at or about 0.1 M/L. Any source of periodate ions can be used. The source of periodate ions in the second composition or the combined composition can be periodic acid or any salt thereof or any combination thereof. Exemplary salts of periodic acid include sodium periodate, potassium periodate, and other water soluble salts. The salts can be used alone or in combination.

The combined composition can include sulfuric acid at a concentration in the range of at or about 15.4 M/L to at or about 17.5 M/L, nitric acid at a concentration greater than 0.013 M/L, and periodate ions at a concentration greater than 0.01 M/L. In some embodiments, the combined composition can include a concentration of sulfuric acid at or about 16.9 M/L, nitric acid at a concentration of at or about 0.130 M/L, and periodate ions at a concentration of at or about 0.1 M/L.

For the two-step process, the surface of the substrate can be contacted with the first composition for at least 1 minute, or for at least 10 minutes, or from about 1 minute to about 10 minutes, and the treated surface then can be treated with the second composition for at least 1 minute, or for at least 4 minutes, or from about 1 minute to about 8 minutes.

For the one-step process, the surface of the substrate can be contacted with the combined composition for at least 1 minute, for at least 4 minutes, or from about 1 minutes to about 5 minutes.

For any of the chrome-free pretreatment processes provided herein, the contacting step can be performed by dipping, spraying, rolling, brushing, dripping, pouring, curtain coating, or any combination thereof.

A surface on any plastic substrate can be treated using one of the chrome-free pretreatment processes provided herein. The substrate can contain a polymer that is crystalline, semi-crystalline or amorphous or combinations thereof. The substrate can include a material selected from among reinforced or unreinforced acrylonitrile-butadiene-styrene (ABS), polyethylene (PE), polypropylene (PP), poly-ether-ether-ketone (PEEK), polyimide, polyetherimide, polycarbonate, polyvinyl, polyvinyl chloride (PVC), epoxy resin, phenolic resin, melamine resin, polyester resin, urea resin, melamine resin, polybutadiene, polyisoprene, butadiene-styrene copolymer, polyurethane, polyamide, polyphthalamide, polyphthalate, polystyrene, polysulfone, neoprene, polybutadiene, polyisoprene, polyacrylic, butadiene-styrene copolymer, and polytetrafluoroethylene (PTFE) and combinations thereof. In some applications, the substrate includes a polymer selected from among polyethylene (PE), polypropylene (PP), polyvinyl chloride, polyimides, polyetherimides and combinations thereof, where the polymer can be unreinforced or reinforced with a reinforcing material. In some applications, the substrate includes a reinforced or unreinforced polyimide. In some applications, the substrate includes a reinforced or unreinforced polyetherimide. In some applications, the substrate includes a reinforced or unreinforced polyvinylchloride. In some applications, the substrate includes a reinforced or unreinforced PEEK. In some applications, the substrate includes a reinforced or unreinforced ABS.

When present, the reinforcing material can be selected from among a metal, a metal oxide, a carbide of B, Cr, Bi, Si, and W, a nitride of B, Cr, Bi, Si, and W, carbon, carbon fibers, carbon nanotubes, graphene sheets, buckeyballs, graphite, graphite fibers, glass, glass fibers, fiberglass, metal-coated glass fibers, metal-coated carbon fibers, metal-coated graphite fibers, talc, calcium silicate, silica, calcium carbonate, alumina, titanium dioxide, ferrite, mica and mixed silicates and any combination thereof. In some applications, the reinforcing material is selected from among glass fiber, fiberglass, a metalized fiber and a mineral filler and any combination thereof.

The chrome-free pretreatment processes provided herein enhance and promote the adhesion of a metal coating to a plastic surface treated with one of the processes provided herein when compared to the adhesion achieved when the substrate is pretreated with chromic acid. The chrome-free pretreatment processes provided herein are free of chromium ions.

Also provided are methods of metallizing a surface of a plastic or polymer article, the methods including as steps treating the surface using any one of the chrome-free pretreatment processes provided herein to yield an adherent surface; and metallizing the adherent surface by applying a metal coating. The metal coating can be applied by electroless (i.e. autocatalytic), plating, direct electroplating, sputtering, thermal spraying, metal vapor deposition and other appropriate techniques for metal layer forming or by any two or more of these techniques, or a combination thereof. When tested according to ASTM International Test Method B533-85 (2013), the adhesion of the metal to the surface of the substrate is greater than 1 N/mm.

The metal coating on the surface can be exposed to a finishing treatment. Examples of finishing treatments include plating with any other metal coating, polishing the metal surface, chromating, phosphating or other finishing techniques and top coatings and combinations thereof. Exemplary top coatings include a paint, a rust preventive, an alkyd finish, a polyester finish, a thermosetting acrylic finish, a thermoplastic acrylic finish, an abrasive resistant coating, a non-stick coating, an anti-microbial coating, an electrically conductive coating and a combination thereof.

Also provided are metallized articles produced by any of the metallizing methods described herein. The metallized articles can be used in any of a number of applications, such as aerospace applications, appliances, automotive applications, defense applications, electronic applications, industrial components, medical applications and sporting goods.

DETAILED DESCRIPTION

All patents, patent applications, published applications and publications, and other published materials referred to throughout the entire disclosure herein, unless noted otherwise, are incorporated by reference in their entirety.

Applying metal coatings to the surface of a plastic or polymer part is of commercial interest because of the desirable properties obtained by combining plastics or polymers with metals. Due to the low cost of plastic or polymer production, and the ease of shaping and processing plastics by various means, plastics and polymeric materials are widely used in the production of parts.

Unlike metal parts, plastic or polymeric parts can suffer from deficiencies due to the polymeric substrate, such as poor strength, low hardness, low wear resistance, low erosion resistance, porosity, and crack formation during forming, handling or abuse. Reinforcing materials, such as graphite, graphite fibers, carbon and carbon nanotubes, glass, glass fibers and other inorganic fillers, metals and combinations thereof, can be added to provide strength, and wear and erosion resistance. Metallizing the plastic or polymeric part also can address some or all of the underlying deficiencies of plastic parts. Metallic coatings are strong, hard, tough and substantially porosity free. These coatings can be applied by various commercial process methods, such as electroless deposition techniques or electroplating or a combination thereof. The metal deposits must adhere well to the underlying polymer substrate even in corrosive environments and when subjected to stress, impact, thermal cycling, erosion and wear, as encountered in outdoor or industrial service.

Many of the plastics used for metallization are specially designed for metallization, such as acrylonitrile butadiene styrene (ABS) and ABS-containing blends. Though these plastics are comparatively active chemically, pretreatment with chromic acid followed by an electrolessly plated or by directly electroplated metal layer is generally required for good adhesion with substrate. Although ABS and ABS-containing blends are useful for many applications, some applications require plastics or polymers that exhibit properties not possessed by ABS. In particular, it is desirable to be able to metallize plastics and polymers that exhibit enhanced physical or thermal properties compared to ABS. A number of plastics having exceptional physical and thermal properties have been identified as candidates for metallization. These include glass reinforced polyetherimides (e.g., amorphous thermoplastic polyetherimides, such as Ultem®, available from SABIC Innovative Plastics, Pittsfield, Mass.); polyphenylene sulfides (e.g., Ryton®, available from Chevron Phillips Chemical Company LLC, The Woodlands, Tex.); and polyimide films, such as Kapton® polyimide films (available from DuPont, Wilmington, Del.).

There have been a number of adhesional pre-treatment methods proposed for polyimides and in particular polyetherimides. The majority of those methods include treatments in strongly alkaline and strongly acidic solutions containing various additives or oxidizers, such as hexavalent chromium or permanganate. However, for polyimide films and glass reinforced polyetherimides, a reliably working chrome-free adhesional pretreatment process is not known in the art due to deficiencies in adhesional strength of subsequent metallic platings. For example, current adhesional pretreatment techniques for glass reinforced polyetherimides create adhesion by an initially applied mechanical abrasion step followed by severe chemical etching of the plastic's surface using hexavalent chromium at elevated temperatures to further roughen the surface. Due to the presence of glass fibers at the plastic parts surface, or not properly making the surface adhesionally active through use of current pre-treatment operations, the subsequently plated parts fail to exhibit adequate coating adhesion and the parts are subsequently reworked using the same pre-treatments, which often causes rejections of parts due to out-of-tolerance dimensional reasons, poor plating quality, or failure to meet end user cosmetic requirements.

In developing chrome-free pretreatment processes for metallizing plastics and polymers, it was found by us that periodate ions in the presence of sulfuric acid are able to react with some plastics surface. The chrome-free pretreatment processes provided herein are particularly useful for activating the surface of an article containing polyvinyl chloride, polyimides, polyetherimides, and combinations thereof, whether the plastics are reinforced or unreinforced. The chrome-free pretreatment processes provided herein create an adhesionally very effective surface chemical structure for subsequent electroless or direct electrolytic metallization of the plastic.

It was observed that higher concentrations of sulfuric acid resulted in a faster reaction of the periodate ions with plastic's surface. The concentration of the sulfuric acid in solution is limited by the possible destruction of the bulk polymeric material if it is too high. It also was determined that the surface reaction with periodate ions is enhanced by pretreating the surface with nitric acid, or by including nitric acid in the sulfuric acid without pretreating the surface with nitric acid. The chrome-free pretreatment processes provided herein allows a high concentration of polar groups to be achieved on the surface, resulting in an unusually high adhesion of subsequent metal coating to the surface, achieving adhesion values not previously obtained and exhibiting unusually high values for that kind of plastic. Any source of periodate ions can be used. Exemplary sources of periodate ions include periodic acid, and any water soluble periodate salts such as sodium periodate, potassium periodate and others and any combination thereof.

The chrome-free pretreatment processes provided herein for preparing adherent surfaces of plastics and polymers are more efficient than previous methods because they require fewer steps. For example, the metallizing process described in U.S. Pat. No. 4,959,121 requires numerous steps, including treatment in concentrated nitric acid at room temperature, followed by treatment in the concentrated sulfuric acid, followed by treatment with strongly alkaline solution of sodium hydroxide, and finalizing the pre-treatment by contacting the polyimide with an alkaline permanganate solution. The chrome-free pretreatment processes provided herein for preparing adherent surfaces of plastics and polymers for metallizing plastics and polymers eliminates many of the process steps required in the prior art, such as treatment with strong alkaline solutions or with alkaline permanganate solutions, while achieving unusually high metal coating adhesion.

The chrome-free pretreatment processes provided herein result in an adherent surface of an article that exhibits high adhesion to a subsequently applied metallic layer. The metallized coating can enhance the strength and durability of the article. By using one of the chrome-free pretreatment processes provided herein, good adhesion is achieved between the metallic layers and the polymer or polymer composite substrate, resulting in excellent thermal cycling performance. Because the chrome-free pretreatment processes provided herein eliminates the use of chromium ions in the process, the pretreatment processes provided herein are more eco-friendly. Because the chrome-free pretreatment processes provided herein reduce the number of steps of the multi-step processes of other pretreatment processes, the number of multiple reaction vessels is reduced and the efficiency of the process is increased.

The chrome-free pretreatment processes provided herein can be used as a pretreatment for metallizing at least partially an inner or outer surface of a substrate, including parts that have complex shapes or curves. The parts, once pretreated with the chrome-free pretreatment processes provided herein, can be metallized using any method known in the art. In some applications, metallization is via electroless plating or via electroplating. The plated plastic parts are strong, lightweight, exhibit high toughness and stiffness (e.g., resistant to deflection), are substantially porosity free, and are able to withstand repeated thermal cycling without degradation.

The metallized plastic substrates can be used in any of a number of applications, such as aerospace applications, appliances, automotive applications, defense applications, electronic applications, industrial components, medical applications and sporting goods. Various applications including, but not limited to, aircraft and other transportation vehicle parts, require a high reliability of any metallized coating. Accordingly, one of the objectives relates to a method for enhancing the durability and structural integrity of a plastic or polymeric part upon fabrication by the application of the conforming metallic coating. The method comprises (a) preparing/activating the surface of the polymer part to receive a metallic coating thereon using one of the chrome-free pretreatment processes described herein; and (b) metallizing the prepared surface via electroless plating or direct electroplating.

The surface prepared using any of the chrome-free pretreatment processes provided herein can be metallized via any method. Exemplary methods of applying a metallic coating include electroless deposition, immersion plating, electroplating, sputtering, thermal spraying, chemical vapor deposition, physical vapor deposition or by any two or more of these techniques. One or more metallic coating layers of a single or several chemistries and micro-structures can be applied. The metallic coating can be exposed to a finishing treatment, such as polishing, and/or additional coatings can be applied, such as chromium plating, or top coatings, such as a paint, a rust preventive, an alkyd finish, a polyester finish, a thermosetting acrylic finish, a thermoplastic acrylic finish, an abrasive resistant coating, a non-stick coating, an anti-microbial coating, an electrically conductive coating or a combination thereof, can be applied.

The chrome-free pretreatment processes provided herein can eliminate the need for physical modifications to the substrate surface, because the chemical etching achieves adhesion values that exceed those achieved with prior art techniques that include physical modifications to the substrate surface. Accordingly, the chrome-free pretreatment processes provided herein eliminate the need to mechanically abrade or roughen the plastic surface, e.g., by sanding, grid blasting, grinding or machining or any combination thereof, in order to enhance the adhesion of the metallic coating to the surface of the plastic article. This reduces or eliminates rejection of parts due to dimensional reasons attributable to mechanical surface modification.

After the surface of a plastic article has been pretreated with one of the pretreatment processes provided herein, the resulting adherent surface can be metallized. Any one of a number of plating processes can be used to metallize the adherent surface. When electroplating is to be used to apply the metallic layer to the polymer substrate, the polymer substrate, after suitably being made adherent using the chrome-free pretreatment processes provided herein, can be activated to enhance the surface conductivity, typically by applying an electroconductive layer. The electroconductive layer can include a conductive polymer (e.g., electro-conductive polymer), dispersions of conductive particles, or an electro-conductive salt or combinations thereof. The electroconductive salt should be insoluble. Examples of insoluble electro-conductive salts include copper sulfides and cobalt sulfides. Conductive polymers suitable for use are known in the art (e.g., see U.S. Pat. No. 5,183,552 (1993); U.S. Pat. No. 5,776,587 (1998); U.S. Pat. No. 6,149,840 (2000); U.S. Pat. No. 6,290,832 (2001); U.S. Pat. No. 6,325,910 (2001); U.S. Pat. No. 6,589,593 (2003); U.S. Pat. No. 6,743,501 (2004); and U.S. Pat. No. 6,984,446 (2006)). Methods for forming a conductive polymer are known in the art. For example, a solution of a stabilizing agent, other additives as desired and monomer are prepared and a polymerizing agent, such as an oxidant, is added with agitation to form the polymer in the presence of the stabilizing agent and to disperse the polymer in a dispersant. Reaction conditions are in air at about room temperature or as necessary to dissolve the reactants. Dispersions of conductive particles for formation of an electroconductive layer are known in the art (e.g., U.S. Pat. No. 6,039,859 (2000)). Typical dispersions of conductive particles include dispersions of carbon and graphite (see U.S. Pat. No. 4,834,910 (1989); U.S. Pat. No. 4,874,477 (1989) and U.S. Pat. No. 5,476,580 (1995)); metals, such as silver, copper and palladium (see U.S. Pat. No. 5,500,106 (1996)); metal salts, such as metal chlorides, oxides or sulfides (see U.S. Pat. No. 5,268,024 (1993) and U.S. Pat. No. 5,269,973 (1993)); and organic polymers (see U.S. Pat. No. 5,415,762 (1995)), or any combination thereof.

The electroconductive layer can contain a noble metal. Any noble metal can be included, such as gold, iridium, silver, osmium, palladium, platinum, rhodium and ruthenium, or an combination thereof. The electroconductive layer can include a layer of copper or cobalt or nickel, and can be formed electrolessly or electroplated. For example, the adherent surface produced by the chrome-free pretreatment processes provided herein can be treated with a palladium/tin oxide-colloid solution and then with a solution by means of which the adsorbed tin compounds are again removed from the surfaces and then metallized with a copper solution containing pyrophosphate (see U.S. Pat. No. 3,099,608 (1963)). As another example, the adherent surface can be treated with a palladium/tin oxide-colloid solution which additionally contains salts of aluminum, titanium, zirconium or hafnium and organic hydroxy compounds, surface-active compounds, polycarboxylic acids, and water-soluble polymers are used as promoter materials, and thereafter electrolytic metallization can take place (see U.S. Pat. No. 4,790,913 (1988) and U.S. Pat. No. 4,891,069 (1990)).

An electroconductive layer can be applied by treating the adherent surface with a solution containing a copper salt or a cobalt salt or a combination thereof followed by treating with a solution containing chalcogenide ions. The chalcogenide ions can include sulfide ions. The copper solution or cobalt solution can be a real solution or a colloidal solution.

As another example, the adherent surface can be treated with a colloid solution containing a noble metal, and then with a solution containing a metal chalcogenide, such as a metal sulfide, selenide or telluride (see U.S. Pat. No. 4,895,739 (1990); U.S. Pat. No. 4,952,286 (1990); and U.S. Pat. No. 5,007,990 (1991)). Any metal chalcogenide can be used. An exemplary metal chalcogenide is sodium sulfide. Noble metal solutions stabilized with organic protective colloids can be used. Such solutions are less sensitive to oxidation than the palladium/tin oxide-colloid solutions mentioned above. Such noble metal solutions also can be used for processes with electroless metallization baths, such as alkaline copper baths (see U.S. Pat. No. 4,004,051 (1977) and U.S. Pat. No. 4,652,311 (1987)).

In some applications, the electroconductive layer contains no Pd, Au or Ag. The electroconductive layer can contain carbon that can be applied to the substrate surfaces in order to generate surface conductivity (see U.S. Pat. No. 4,631,117 (1986) and U.S. Pat. No. 4,874,477 (1989)). In some applications, the solutions used in the methods are free of ammonia or amines.

The electroconductive layer can be deposited by electroless (autocatalytic) plating, immersion plating, direct electroplating, sputtering, thermal spraying, chemical vapor deposition, physical vapor deposition or by any two or more of these techniques. Where the electroconductive layer contains polymer material with conductive particulates therein, it can be, e.g., a conductive paint or a conductive epoxy. The conductive particulates can be composed of or contain Al, Ag, Co, Cu, Ni or Ti or graphite or other conductive carbon or a combination of two or more of these. The electroconductive layer suitably renders the polymer substrate electrically conductive for the application of metallic layers, e.g., by electroplating. The electroconductive layer can be applied by a variety of techniques, such as molding, spreading, painting, or spraying or any combination thereof, and can be followed by drying or partial or complete curing. Electroconductive layers can be deposited on the plastic substrate surface properly prepared by first using the chrome-free pretreatment processes provided herein, by a process selected from among electroless plating, direct electroplating, physical vapor deposition (PVD), chemical vapor deposition (CVD), powder spraying and gas condensation. Multiple electroconductive layers can be applied to the surface of the plastic substrate.

For samples that are to be metallized using electroless nickel plating, any method known in the art can be used after the plastic substrate surface properly is prepared by first using the chrome-free pretreatment processes provided herein (e.g., see U.S. Pat. No. 5,212,138 (1993); U.S. Pat. No. 5,500,315 (1996); U.S. Pat. No. 5,830,805 (1998); U.S. Pat. No. 7,147,896 (2006); U.S. Pat. No. 7,744,685 (2010); U.S. Pat. No. 8,197,583 (2012); and U.S. Pat. No. 8,309,164 (2012)). In an exemplary method, the plastic surface with the adherent surface produced by a chrome-free pretreatment process provided herein is treated at ambient temperature in a solution containing $PdCl_2$ and NaCl, at a pH of between about 4 to about 6 for a time period of from 1 to 10 minutes. In some applications, the pH is about 4, 4.5, 5, 5.5 or 6, and the time is at least 5 minutes. The sample then is rinsed and additionally treated in a reducing solution containing $NaH_2PO_2$ (sodium hypophosphite), at an alkaline pH, such as at least about 9, at an elevated temperature, such as greater than about 50° C., or between about 50° C. and 90° C., or at least 60° C., for a time period of between about 5 minutes and about 15 minutes, such as 8 minutes at 60° C. The samples then can be electroless nickel plated using nickel plating solutions, such as Atotech Adhemax Ni LFS nickel plating solutions for plastics, at a temperature of at least about 40° C. for a time period between about 5 minutes and 30 minutes, such as at about 40° C. for 15 minutes.

For samples that are to be metallized using direct nickel electroplating, after the plastic substrate surface properly is prepared by first using the chrome-free pretreatment processes provided herein any metallizing method known in the art can be used. See, e.g., U.S. Pat. No. 4,959,121 (1990); U.S. Pat. No. 6,331,239 (2001); U.S. Pat. No. 6,712,948 (2004); U.S. Pat. No. 7,780,771 (2010); U.S. Pat. No. 8,366,901 (2013); and U.S. Pat. No. 8,580,100 (2013).

For direct nickel electroplating, the samples can be treated at ambient temperature with a solution containing $CoCl_2$ (cobalt chloride). The solution can be a real solution or a colloidal solution. In some applications, the pH can be acidic, e.g., about 6.5 or less, or from about 5 to about 6, for a time period from about 1 minute to about 10 minutes, such as 1, 2, 3, 4, 5, 6, 7, 8, 9 or 10 minutes, followed by dipping the sample into a solution containing $Na_2S$ (sodium sulfide) for a time period of from about 0.5 minute to about 5 minutes, such as about 1 minute, at ambient temperature and then, after rinsing with ambient temperature water, electroplating the sample in a conventional Watts nickel plating bath containing $NiSO_4.7H_2O$, $NiCl_2.6H_2O$ and $H_3BO_3$, at a temperature of at least 40° C., or a temperature from about 40° C. to 60° C., such as 45° C., at a current density of at least 1 A/dm$^2$, or at a current density from about 1 A/dm$^2$ to about 5 A/dm$^2$, such as 2 A/dm$^2$, for a time period of at least 0.5 minutes, or a time period of from about 1 minute to about 15 minutes, such as for about 10 minutes. The treatments can be performed at ambient pressure and humidity.

Plastic or Polymer Substrate

The substrate to be pretreated can include any plastic amenable to the metallizing process. The plastics can be reinforced or unreinforced. For example, the substrate can include one or any combination of acrylonitrile-butadiene-styrene (ABS); thermoplastic polymers such as thermoplastic polyolefins including polyethylene (PE) and polypropylene (PP); polyimides; polyetherimides; poly-ether-ether-ketone (PEEK); polycarbonates; polyvinyls; chlorinated polyvinyls, such as polyvinyl chloride (PVC); epoxy resins; phenolic resins; melamine resins; polyester resins; urea resins; melamine resins; polybutadienes; polyisoprenes; butadiene-styrene copolymers; polyurethanes; polyamides; polyphthalamides; polyphthalates; polystyrene; polysulfone; polyimides; neoprenes; polybutadienes; polyisoprenes; polyacrylics; butadiene-styrene copolymers; and fluorinated polymers such as polytetrafluoroethylene (PTFE) and combinations thereof. In some applications, the plastic substrate is made of or contains a polymer selected from among a polyimide, polyvinylchloride, PEEK, polyetherimide or a combination thereof, and the polymer can be reinforced or unreinforced. The substrate can include polymers that are crystalline, semi-crystalline or amorphous or combinations thereof.

In some applications, the substrate contains a reinforced plastic or polymer. Any reinforcing material can be included in the substrate. Examples of reinforcing materials include metals (e.g., Ag, Al, In, Mg, Si, Sn, Pt, Ti, V, W, and Zn and combinations thereof); metal oxides (e.g., $Ag_2O$, $Al_2O_3$, $SiO_2$, $SnO_2$, $TiO_2$ and ZnO); carbides of B, Cr, Bi, Si, and W; nitrides of B, Cr, Bi, Si, and W; carbon (e.g., carbon fibers, carbon nanotubes, graphene sheets, buckeyballs, graphite, graphite fibers); glass; glass fibers; fiberglass; metalized fibers, such as metal-coated glass, metal-coated carbon and metal-coated graphite fibers; mineral/ceramic fillers, such as talc, calcium silicate, silica, calcium carbonate, alumina, titanium dioxide, ferrite, mica and mixed silicates or any combination thereof. In some applications, the substrate includes a plastic reinforced with glass fiber, fiberglass, metalized fibers or a mineral filler or any combination thereof.

Optionally, before using a substrate in the methods of the present invention, the substrate can be cleaned. Typically, the cleaning can be done by washing with water, optionally containing a surfactant solution or solvents or combinations thereof. The water can be tap, deionized or distilled water. Generally the washing step, if performed, is performed at ambient temperatures. Elevated wash temperatures can be used. Solvents other than water also can be used, alone or in combination with water.

Chrome-Free Pretreatment Process

Provided herein are chrome-free pretreatment methods for activating a surface of a plastic article that is to be metallized. The methods enhance and promote the adhesion of a metal coating to the surface. The methods include contacting a surface of a substrate with:
  (a) a first composition containing at least 7.9 M/L nitric acid, followed by treatment with a second composition containing at least 15.4 M/L sulfuric acid and periodate ions in an amount greater than 0.01 M/L to produce an adherent surface; or
  (b) contacting a surface of the substrate with a combined composition containing from about 0.013 M/L to about 0.130 M/L nitric acid, from about 15.4 M/L to about 16.9 M/L sulfuric acid, and periodate ions in an amount greater than 0.01 M/L to produce an adherent surface.

The methods can be performed at ambient temperature, pressure and humidity.

Two-Step Pretreatment Process to Produce an Adherent Surface

In one embodiment, the substrate is treated with a first composition containing at least 7.9 M/L nitric acid. In some applications, the first composition contains from about 5.5 to 13 M/L nitric acid. The first composition can contain 5.5 M/L, 6 M/L, 6.5 M/L, 7 M/L, 7.5 M/L, 8 M/L, 8.5 M/L, 9 M/L, 9.5 M/L, 10 M/L, 10.5 M/L, 11 M/L, 11.5 M/L, 12 M/L, 12.5 M/L or 13 M/L nitric acid, or the nitric acid can be in a range of at or about a to at or about b, where a is any one of the preceding concentrations of nitric acid and b is any one of the preceding concentrations of nitric acid >a, such as from 6 M/L to 12.5 M/L, or 6.5 M/L to 11.5 M/L, etc. In some applications, 13 M/L nitric acid is preferred.

The substrate to be treated is brought into contact with the first composition for a time period of at least 1 minute. In some applications, the substrate to be treated is brought into contact with the first composition for a time period of from about 1 minute to about 30 minutes, or from about 5 minutes to about 25 minutes, or from about 10 minutes to about 20 minutes, or from about 1 minute to about 20 minutes. The contacting step can be any time selected from 1 min., 2 min., 3 min., 4 min., 5 min., 6 min., 7 min., 8 min., 9 min., 10 min., 11 min., 12 min., 13 min., 14 min., 15 min., 16 min., 17 min., 18 min., 19 min., 20 min., 21 min., 22 min., 23 min., 24 min., 25 min., 26 min., 27 min., 28 min., 29 min., and 30 min.

The substrate to be treated is brought into contact with the first composition using any appropriate technique. Examples of methods via which the substrate to be treated can be brought into contact with the first composition include dipping, spraying, rolling, brushing, dripping, pouring, immersion, curtain coating, and electrocoating or any combination thereof. The treatment with nitric acid can performed at ambient temperature, or can be performed at a temperature from at or about 10° C. to at or about 40° C. The treatment can be performed at ambient pressure and humidity.

The treated sample can be washed prior to treatment with the second composition. The treated sample can be washed with a solvent. In some applications, the solvent is water, which can be tap water, deionized water or distilled water. The temperature of the water can be ambient temperature, or can be in a range of from at or about 10° C. to at or about 40° C. The washing step can be accomplished by applying water to the sample using any appropriate technique. For example, the sample can be washed by dipping or immersing the sample in water, or by spraying, rolling, brushing, dripping, or pouring water over the sample, or any combination of these methods. In some embodiments, the sample is immersed in water of ambient temperature for at least 1 minute. The water can be removed from the sample using any appropriate technique. For example, the water on the sample can be removed using clean oil-free compressed air, compressed dry nitrogen, compressed dry carbon dioxide or other compressed dry gas. The dry gas can be applied at ambient temperature, or the temperature can be in a range of from at or about 10° C. to at or about 40° C.

The substrate then is brought into contact with a second composition containing at least 14 M/L sulfuric acid and periodate ions in an amount greater than 0.01 M/L. In some applications, the second composition contains from at or about 14.1 M/L to at or about 17.5 M/L sulfuric acid. The second composition can contain 14.1 M/L, 14.2 M/L, 14.3 M/L, 14.4 M/L, 14.5 M/L, 14.6 M/L, 14.7 M/L, 14.8 M/L, 14.9 M/L, 15 M/L, 15.1 M/L, 15.2 M/L, 15.3 M/L, 15.4 M/L, 15.5 M/L, 15.6 M/L, 15.7 M/L, 15.8 M/L, 15.9 M/L, 16 M/L, 16.1 M/L, 16.2 M/L, 16.3 M/L, 16.4 M/L, 16.5 M/L, 16.6 M/L, 16.7 M/L, 16.8 M/L, 16.9 M/L, 17 M/L, 17.1 M/L, 17.2 M/L, 17.3 M/L, 17.4 M/L or 17.5 M/L sulfuric acid, or the sulfuric acid can be in a range of at or about c to at or about d, where c is any one of the preceding concentrations of sulfuric acid and d is any one of the preceding concentrations of sulfuric acid >c, such as from 14.1 M/L to 17.4 M/L, or 14.2 M/L to 17.3 M/L, etc. In some applications, 16.9 M/L sulfuric acid is preferred.

The second composition also contains from about 0.01 to about 0.2 M/L sodium periodate, or from about 0.02 to about 0.15 M/L periodate ions. The second composition can include 0.01 M/L, 0.02 M/L, 0.03, 0.04, 0.05, 0.06, 0.07, 0.08, 0.09, 0.10, 0.11 M/L, 0.12 M/L, 0.13, 0.14, 0.15, 0.16, 0.17, 0.18, 0.19 or 0.20 M/L periodate ions, or the periodate ions and be in a range of at or about e to at or about f, where e is any one of the preceding concentrations of periodate ions and f is any one of the preceding concentrations of periodate ions >e, such as from 0.01 M/L to 0.19 M/L, or 0.02 M/L to 0.18 M/L, etc. Any recited range of concentration of sulfuric acid can be combined with any recited range of concentration of periodate ions. Any recited concentration of sulfuric acid can be combined with any recited concentration of periodate ions.

Any source of periodate ions can be used in the second composition. Exemplary sources of periodate ions include periodic acid and any salt of periodate and any combination thereof. Exemplary salts of periodic acid include sodium periodate, potassium periodate, magnesium periodate, a copper periodate, and calcium periodate and any combination thereof.

The treatment with nitric acid can performed at ambient temperature, or can be performed at a temperature from at or about 10° C. to at or about 40° C. The treatment can be performed at ambient pressure and humidity.

Any first composition can be selected to be used with any second composition. In some applications, the first composition includes 13 M/L nitric acid, and the second composition includes 16.9 M/L sulfuric acid and at least 0.01 M/L periodate ions.

The substrate to be treated is brought into contact with the second composition for a time period of at least 1 minute. In some applications, the substrate to be treated is brought into contact with the second composition for a time period of from about 1 minute to about 30 minutes, or from about 5 minutes to about 25 minutes, or from about 10 minutes to about 20 minutes, or from about 1 minutes to about 10 minutes. The contacting step can be any time selected from 1 min., 2 min., 3 min., 4 min., 5 min., 6 min., 7 min., 8 min., 9 min., 10 min., 11 min., 12 min., 13 min., 14 min., 15 min., 16 min., 17 min., 18 min., 19 min., 20 min., 21 min., 22 min., 23 min., 24 min., 25 min., 26 min., 27 min., 28 min., 29 min., and 30 min.

The substrate to be treated is brought into contact with the second composition using any appropriate technique. Examples of methods via which the substrate to be treated can be brought into contact with the first composition include dipping, spraying, rolling, brushing, dripping, pouring, immersion, curtain coating, and electrocoating or any combination thereof.

The treatment with the second composition can performed at ambient temperature, or can be performed at a temperature from at or about 10° C. to at or about 40° C. The treatment can be performed at ambient pressure and humidity.

The treated sample can be washed prior to metallization. The treated sample can be washed with a solvent, which can be or contain water. In some applications, the treated sample can be washed with water, which can be at ambient temperature, or can be at a temperature in the range of from at or about 10° C. to at or about 40° C. The washing step can be accomplished by applying water to the sample using any appropriate technique. For example, the sample can be washed by dipping or immersing the sample in water, or by spraying, rolling, brushing, dripping, or pouring water over the sample, or any combination of these methods. In some embodiments, the sample is immersed in water of ambient temperature for at least 1 minute. The water can be removed from the sample using any appropriate technique, e.g., the water on the sample can be removed using clean oil-free compressed air, forced air, compressed dry nitrogen or carbon dioxide, or any other compressed dry gas. The dry gas can be applied at ambient temperature, or the temperature can be in a range of from at or about 10° C. to at or about 40° C.

One-Step Pretreatment Process to Produce an Adherent Surface

In one embodiment, the chrome-free pretreatment can be performed by treatment of a surface of a substrate with a single combined composition containing from about 0.013 to 0.130 M/L nitric acid, from about 15.4 to 17.5 M/L sulfuric acid, and periodate ions in an amount greater than 0.01 M/L, to produce an adherent surface. In some applications, the combined composition can include 0.013 M/L, 0.014 M/L, 0.015 M/L, 0.016 M/L, 0.017 M/L, 0.018 M/L, 0.019 M/L, 0.02 M/L, 0.021 M/L, 0.022 M/L, 0.023 M/L, 0.024 M/L, 0.025 M/L, 0.026 M/L, 0.027 M/L, 0.028 M/L, 0.029 M/L, 0.03 M/L, 0.031 M/L, 0.032 M/L, 0.033 M/L, 0.034 M/L, 0.035 M/L, 0.036 M/L, 0.037 M/L, 0.038 M/L, 0.039 M/L, 0.04 M/L, 0.041 M/L, 0.042 M/L, 0.043 M/L, 0.044 M/L, 0.045 M/L, 0.046 M/L, 0.047 M/L, 0.048 M/L, 0.049 M/L, 0.05 M/L, 0.051 M/L, 0.052 M/L, 0.053 M/L, 0.054 M/L, 0.055 M/L, 0.056 M/L, 0.057 M/L, 0.058 M/L, 0.059 M/L, 0.06 M/L, 0.061 M/L, 0.062 M/L, 0.063 M/L, 0.064 M/L, 0.065 M/L, 0.066 M/L, 0.067 M/L, 0.068 M/L, 0.069 M/L, 0.07 M/L, 0.071 M/L, 0.072 M/L, 0.073 M/L, 0.074 M/L, 0.075 M/L, 0.076 M/L, 0.077 M/L, 0.078 M/L, 0.079 M/L, 0.08 M/L, 0.081 M/L, 0.082 M/L, 0.083 M/L, 0.084 M/L, 0.085 M/L, 0.086 M/L, 0.087 M/L, 0.088 M/L, 0.089 M/L, 0.09 M/L, 0.091 M/L, 0.092 M/L, 0.093 M/L, 0.094 M/L, 0.095 M/L, 0.096 M/L, 0.097 M/L, 0.098 M/L, 0.099 M/L, 0.1 M/L, 0.101 M/L, 0.102 M/L, 0.103 M/L, 0.104 M/L, 0.105 M/L, 0.106 M/L, 0.107 M/L, 0.108 M/L, 0.109 M/L, 0.11 M/L, 0.111 M/L, 0.112 M/L, 0.113 M/L, 0.114 M/L, 0.115 M/L, 0.116 M/L, 0.117 M/L, 0.118 M/L, 0.119 M/L, 0.12 M/L, 0.121 M/L, 0.122 M/L, 0.123 M/L, 0.124 M/L, 0.125 M/L, 0.126 M/L, 0.127 M/L, 0.128 M/L, 0.129 M/L or 0.13 M/L nitric acid, or the nitric acid can be in a range of at or about m to at or about n, where m is any one of the preceding concentrations of nitric acid and n is any one of the preceding concentrations of nitric acid>m, such as from 0.014 M/L to 0.129 M/L, or 0.015 M/L to 0.129 M/L, etc.

In some applications, the combined composition can include 14.1 M/L, 14.2 M/L, 14.3 M/L, 14.4 M/L, 14.5 M/L, 14.6 M/L, 14.7 M/L, 14.8 M/L, 14.9 M/L, 15 M/L, 15.1 M/L, 15.2 M/L, 15.3 M/L, 15.4 M/L, 15.5 M/L, 15.6 M/L, 15.7 M/L, 15.8 M/L, 15.9 M/L, 16 M/L, 16.1 M/L, 16.2 M/L, 16.3 M/L, 16.4 M/L, 16.5 M/L, 16.6 M/L, 16.7 M/L, 16.8 M/L, 16.9 M/L, 17 M/L, 17.1 M/L, 17.2 M/L, 17.3 M/L, 17.4 M/L or 17.5 M/L sulfuric acid, or the sulfuric acid can be in a range of at or about o to at or about p, where o is any one of the preceding concentrations of sulfuric acid and p is any one of the preceding concentrations of sulfuric acid >o, such as from 14.1 M/L to 17.4 M/L, or 14.2 M/L to 17.3 M/L, etc. In some applications, 16.9 M/L sulfuric acid is preferred.

In some applications, the combined composition can include 0.01 M/L, 0.02 M/L, 0.03 M/L, 0.04 M/L, 0.05 M/L, 0.06 M/L, 0.07 M/L, 0.08 M/L, 0.09 M/L, 0.10 M/L, 0.11 M/L, 0.12 M/L, 0.13 M/L, 0.14 M/L, 0.15 M/L, 0.16 M/L, 0.17 M/L, 0.18 M/L, 0.19 M/L or 0.20 M/L periodate ions, or the periodate ions can be in a range of at or about q to at or about r, where q is any one of the preceding concentrations of periodate ions and r is any one of the preceding concentrations of periodate ions >q, such as from 0.02 M/L to 0.20 M/L, or 0.02 M/L to 0.19 M/L, etc.

Any recited range of concentration of nitric acid can be combined with any recited range of concentration of sulfuric acid and any recited range of concentration of periodate ions. Any recited concentration of nitric acid can be combined with any recited concentration of sulfuric acid and any recited concentration of periodate ions.

Any source of periodate ions can be used in the combined composition. Exemplary sources of periodate ions include periodic acid and any soluble salt of periodate and any combination thereof. Exemplary soluble salts of periodic acid include sodium periodate, potassium periodate, magnesium periodate, ammonium periodate, a copper periodate, and calcium periodate and any combination thereof.

The substrate to be treated is brought into contact with the combined composition for a time period of at least 1 minute. In some applications, the substrate to be treated is brought into contact with the combined composition for a time period of from about 1 minute to about 30 minutes, or from about 5 minutes to about 25 minutes, or from about 10 minutes to about 20 minutes or from about 1 minute to about 10 minutes. The contacting step can be any time selected from 1 min., 2 min., 3 min., 4 min., 5 min., 6 min., 7 min., 8 min., 9 min., 10 min., 11 min., 12 min., 13 min., 14 min., 15 min., 16 min., 17 min., 18 min., 19 min., 20 min., 21 min., 22 min., 23 min., 24 min., 25 min., 26 min., 27 min., 28 min., 29 min., and 30 min.

The substrate to be treated is brought into contact with the combined composition using any appropriate technique. Examples of methods via which the substrate to be treated can be brought into contact with the combined composition include dipping, spraying, rolling, brushing, dripping, pouring, immersion, curtain coating, and electrocoating or any combination thereof.

The treatment with the combined composition can performed at ambient temperature, or can be performed at a temperature from at or about 10° C. to at or about 40° C. The treatment can be performed at ambient pressure and humidity.

The treated sample can be washed prior to metallization. The treated sample can be washed with a solvent. In some applications, the treated sample can be washed with water, which can be at ambient temperature, or can be at a temperature in the range of from at or about 10° C. to at or about 40° C. The washing step can be accomplished by applying water to the sample using any appropriate technique. For example, the sample can be washed by dipping or immersing the sample in water, or by spraying, rolling, brushing, dripping, or pouring water over the sample, or any combination of these methods. In some embodiments, the sample is immersed in water of ambient temperature for at least 1 minute. The water can be removed from the sample using any appropriate technique. For example, the water on the sample can be removed using clean oil-free compressed air, compressed dry nitrogen, compressed dry carbon dioxide or any other compressed dry gas. The dry gas can be applied at ambient temperature, or the temperature can be in a range of from at or about 10° C. to at or about 40° C.

Metallizing Step

The chrome-free pretreatment processes provided herein result in an adherent surface of a substrate that will accept a metallic layer. Provided are methods for metallizing a surface of a plastic or polymer article, which include pretreating the surface of the article using one of the chrome-free pretreatment processes provided herein to yield an adherent surface, activating the adherent surface by applying an electroconductive layer, and applying a metal coating to result in a metallic layer on the plastic article surface.

The metallic layer can contain any desired metal, such as Co, Ni or Cu or a combination of any two or all of these, and can be deposited on the substrate surface using any appropriate technique, such as by electroless deposition, immersion plating, electroplating, sputtering, thermal spraying, chemical vapor deposition, physical vapor deposition or by any two or more of these techniques. In some applications, the metallic layer can be applied to the surface using an electroless deposition technique or via electroplating or a combination thereof. For example, any electroless nickel plating technique or direct electroplating technique can be used.

For example, substrates having adherent surfaces to be metallized using electroless nickel plating can be treated at ambient temperature in a solution containing palladium, such as palladium chloride, and a salt, such as sodium chloride at acidic conditions, such as a pH of between about 3 to 6, such as a pH of about 4. The treatment in the palladium bath can be done for an appropriate time, such as between about 1 to 10 minutes. After being exposed to the palladium bath, the substrates can be rinsed with water and additionally treated in a reducing solution containing $NaH_2PO_2$ (sodium hypophosphite) in alkaline conditions, such as a pH of about 9, for a time period of from about 1 to 10 minutes, such as 8 minutes, at a temperature greater than room temperature, such as at a temperature of 60° C. The substrate then can be subjected to electroless nickel plated using Atotech Adhemax Ni LFS nickel plating solutions for plastics (ATOTECH USA, Inc., Rock Hill, S.C.), at a temperature greater than room temperature, such as from about 40° C. to about 60° C., for a time period of between 5 to 30 minutes, such as 15 minutes.

Substrates having adherent surfaces to be metallized using direct nickel electroplating can be treated, for example, at ambient temperature with a solution containing cobalt chloride at a near neutral pH, such as between a pH of 6-8, e.g., at a pH of about 6.5, for a time period between about 1 and 5 minutes, such as for about 2 minutes, followed by treatment with a solution containing sodium sulfide at ambient temperature for a time period between about 30 seconds and 2 minutes, e.g., about 1 minute, followed by rinsing with deionized water and electroplating in a conventional Watts nickel plating bath (e.g., containing 200 g/L of $NiSO_4.7H_2O$, 40 g/L of $NiCl_2.6H_2O$ and 40 g/L of $H_3BO_3$), at a temperature greater than room temperature, such as from about 40° C. to about 60° C., e.g., at about 45° C., at a current density of 2 Amp/dm² for a time period of between 5 to 30 minutes, such as 10 minutes.

The chrome-free pretreatment processes provided herein result in an adherent surface of a substrate that will accept a metallic layer. Use of any the chrome-free pretreatment processes provided herein to prepare an adherent surface results in enhanced adhesion of a metallic coating applied to the adherent surface. Articles metallized using a process that includes one of the chrome-free pretreatment processes provided herein can be used in a variety of applications. Examples of the applications in which the metallized plastic or polymer articles can be used include aerospace parts including wings, wing parts including flaps and access covers, structural spars and ribs, connectors, propellers, rotors, rotor blades, rudders, covers, housings, fuselage parts, nose cones, landing gear, lightweight cabin parts, ducts and interior panels; military products including ammunition, ammunition casings, armor, and firearm components such as gun barrels; medical equipment including surgical and diagnostic tools, orthopedic prosthesis, and implants; automotive components including heat shields, cabin components including seat parts, steering wheel and armature parts, fluid conduits including air ducts, fuel rails, turbocharger components, oil lines and pans, transmission parts and pans, brake parts, fluid tanks and housings, cylinder head covers, spoilers, grill-guards and running boards, brake, transmission, clutch, steering and suspension parts, brackets and pedals, muffler components, wheels, vehicle frames; fluid pumps such as fuel, coolant, oil and transmission pumps and their components, and electrical and engine covers; cameras and other image recording devices; televisions and television components; components and housings for electronic equipment including DVRs, laptops, cell phones and circuit boards; MP3 players and personal audio devices; electromagnetic interference (EMI) shields; molds and molding tools and equipment; shafts, tubes, pipes and rods, such as for use as baseball bats, bicycle frames, golf clubs (shafts, heads and faceplates), fishing poles, arrow shafts, skiing and hiking pole shafts, and tent poles; drive shafts; wires and cables and other cylindrical or tubular structures for use in commercial goods; racquets for tennis, squash, and badminton; bicycle parts; industrial/consumer products and parts including linings on hydraulic actuators, cylinders and the like; drills; files; knives; saws; blades; frames; and hinges.

EXAMPLES

The following examples are included for illustrative purposes only and are not intended to limit the scope of the embodiments provided herein.

Examples 1-17

Preparation of Metallized Plastic Surfaces—Two-Step Pretreatment Process

Pieces of Ultem® 2300 (30% glass fibers filled polyetherimide) and polyvinylchloride (PVC) (all of which are available from PROFESSIONAL PLASTICS, INC., Fullerton, Calif.), all having flat area not less than 20×50 mm, and also Kapton® polyimide film of 50 μm thickness (available from PROFESSIONAL PLASTICS, INC., Fullerton, Calif.) were used for demonstrating the chrome-free pretreatment process. A sample of each of Ultem® 2300 polyetherimide, PVC and Kapton® polyimide film was adhesionally pretreated using the two-step pretreatment process described herein. The concentrations of the components in the first composition and second composition, and the treatment times, are shown in Table 1.

Each of the plastic substrates was treated with a first composition, which contained nitric acid in an amount of from 0 M/L to 13.0 M/L, by immersing the plastic substrate in the first composition at ambient temperature for a treatment time of between 1 and 20 minutes. After the treatment time concluded, the plastic substrate was washed with water of ambient temperature, dried using compressed, oil-free dry air, and then immersed in the second composition, which contained sulfuric acid at a concentration at or about 15.4 M/L to at or about 17.5 M/L, and sodium periodate at a concentration of at or about 0 to at or about 0.2 M/L at ambient temperature for a treatment time between 1 and 8 minutes. The treatments were performed at ambient pressure and humidity. After the treatment time concluded, the treated plastic substrate was washed with water, dried using compressed, oil-free dry air, and subjected to nickel plating. Any electroless nickel plating technique or direct electroplating technique using electrolytic nickel can be used.

Those samples that were to be electroless nickel plated were activated at ambient temperature in a solution containing 100 mg/L of $PdCl_2$ and 10 g/L of NaCl, at a pH of about 4 for 5 minutes. The samples then were rinsed and additionally treated in a reducing solution containing 20 g/L of $NaH_2PO_2$ (sodium hypophosphite), a pH of about 9 for 8 minutes at 60° C. The samples then were electroless nickel plated using Atotech Adhemax Ni LFS nickel plating solutions for plastics, at 40° C. for 15 minutes.

For direct nickel electroplating, the samples were first treated at ambient temperature solution containing 20 g/L of $CoCl_2$ (cobalt chloride), pH of about 6.5 for about 2 minutes, then followed by dipping into solution containing 10 g/L of $Na_2S$ (sodium sulfide) for about 1 minute at ambient temperature and then, after rinsing with ambient temperature water, were electroplated in a conventional Watts nickel plating bath containing 200 g/L of $NiSO_4.7H_2O$, 40 g/L of $NiCl_2.6H_2O$ and 40 g/L of $H_3BO_3$, at 45° C. at a current density of 2 $A/dm^2$ for 10 minutes. The treatments were performed at ambient pressure and humidity.

To measure the adhesion value between plated nickel coating and plastic surface, the samples then were additionally electroplated with 50 microns of copper coating in electrolyte containing 200 g/L of $CuSO_4.5H_2O$ and 50 g/L $H_2SO_4$ using current density of 2 $A/dm^2$ for about 1 hour. Adhesion measurements were performed according to standard testing, e.g., ASTM B533-85 (2013). A strip of nickel-copper coating 10 mm width was cut through both coatings to the base substrate and then was peeled off under an angle of 90° to the surface at a rate of 50 mm/min while the force applied was fixed as representing the adhesion value. The results are shown in Table 1.

ide treated conventionally using chromic acid (0.9 N/mm, see Table 2 below). The results indicate that for Ultem® 2300 polyetherimide, the highest adhesion values are obtained when the $H_2SO_4$ concentration in the second composition is in the range of at or about 15.4 M/L to at or about 17.5 M/L. The sulfuric acid concentration in the second composition has a critical influence on periodate ion activity while reacting with the Ultem® 2300 polyetherimide: too low a concentration of $H_2SO_4$ does not promote periodate ion activity (e.g., see Table 1, Example 9), and too high a concentration of $H_2SO_4$ causes the surface of the Ultem® 2300 polyetherimide plastic to be degraded, resulting in lower adhesion values (e.g., see Table 1, Example 11). The adhesion values for Ultem® 2300 polyetherimide sharply decrease if the concentration of sulfuric acid in the second composition containing periodate ions is not near 16.9 M/L.

Furthermore, the data show that for Ultem® 2300 polyetherimide, the best adhesion values are achieved when the nitric acid concentration in the first composition of the two-step pretreatment process is in the range of at or about 10.4 M/L to at or about 13.0 M/L (e.g., see Table 1, Examples 1-5). The data for Examples 4 and 5 in Table 1 demonstrate that some adhesion (although less than achieved using traditional chromic acid pretreatment) is achieved using a low nitric acid concentration or even without using nitric acid. These results suggest that the second composition containing concentrated sulfuric acid and periodate ions (from sodium periodate) is still able to create adhesive groups on the polyetherimide's surface even without prior pretreatment with nitric acid. If the first composition containing nitric acid is used before treatment with the second composition, however, the adhesion rate

TABLE 1

Adhesion Measurements - Using Two Step Pretreatment (Ultem = Ultem ® 2300)

| | | First Treatment | | Second Treatment | | | Ni layer |
|---|---|---|---|---|---|---|---|
| Ex. #. | Plastic | $HNO_3$ (M/L) | Treatment Time, min | $H_2SO_4$ (M/L) | $NaIO_4$, (M/L) | Treatment Time, Min. | adhesion to Plastic, N/mm |
| 1 | Ultem | 13.0 | 10 | 16.9 | 0.2 | 4 | 1.5 |
| 2 | Ultem | 10.4 | 10 | 16.9 | 0.2 | 4 | 1.5 |
| 3 | Ultem | 7.9 | 10 | 16.9 | 0.2 | 4 | 0.5 |
| 4 | Ultem | 5.6 | 10 | 16.9 | 0.2 | 4 | 0.4 |
| 5 | Ultem | 0 | — | 16.9 | 0.2 | 4 | 0.4 |
| 6 | Ultem | 13.0 | 2 | 16.9 | 0.2 | 4 | 1.3 |
| 7 | Ultem | 13.0 | 1 | 16.9 | 0.2 | 4 | 1.0 |
| 8 | Ultem | 13.0 | 20 | 16.9 | 0.2 | 4 | 1.5 |
| 9 | Ultem | 13.0 | 10 | 15.4 | 0.2 | 4 | 0.2 |
| 10 | Ultem | 13.0 | 10 | 16.9 | 0.03 | 4 | 1.5 |
| 11 | Ultem | 13.0 | 10 | 17.5 | 0.2 | 4 | 0.1 (Note) |
| 12 | Ultem | 13.0 | 10 | 16.9 | 0.01 | 4 | 1.1 |
| 13 | Ultem | 13.0 | 10 | 16.9 | 0.2 | 1 | 1.0 |
| 14 | Ultem | 13.0 | 10 | 16.9 | 0.2 | 8 | 1.5 |
| 15 | PVC | 13.0 | 10 | 17.5 | 0.2 | 4 | 2.2 |
| 16 | Kapton | 13.0 | 10 | 16.9 | 0.2 | 4 | 2.4 |
| 17 | Ultem | 13.0 | 10 | 16.9 | 0.2 | 2 | 1.3 |
| 18** | Ultem | 13.0 | 10 | 16.9 | 0 | 4 | 0.1 |

(Note): Plastic surface destroyed.
**Comparative Example described in Example 18.

It was found that when using the chrome-free pretreatment processes for metallizing plastics and polymers provided herein, the measured adhesion values are not dependent on how the first nickel layer is deposited—either by an electroless or by direct electroplating process.

As shown in Table 1, the adhesion values for metallized Ultem® 2300 polyetherimide treated using the two-step pretreatment described herein are considerably higher (1.5 N/mm) than those for the same Ultem® 2300 polyetherim- (and probably the density of adhesive groups on the surface as well) is several times higher. A pretreatment time of more than 2 minutes in nitric acid (in two-step pretreatment) according to the results in Table 1, for Ultem® 2300 polyetherimide, is required for optimal performance under the conditions used in the examples (e.g., compare Examples No. 1, 6, and 7 in Table 1). The data demonstrate that the nitric acid pretreatment in the two-step activation process described herein enhances the effectiveness of the second composition (containing sulfuric acid and periodate ions). For example, compare Example 1 (with nitric acid pretreatment step) with Example 5 (no nitric acid).

When comparing the data from Example No. 14 in Table 1 to the data from Examples No. 1, 2, 8, and 14, it is evident that, for Ultem® 2300 polyetherimide, the pretreatment time in the periodate-ion containing solution lasting only 1 minute is not sufficient for achieving maximum adhesion value. However, the same enhanced adhesion results are obtained when treated for 4 minutes, compared with treatment for 8 minutes.

Examples 15 and 16 in Table 1 demonstrate that the chrome-free pretreatment processes provided herein for providing activated plastic surfaces to be metallized can be used for pretreatment of other kinds of plastics (e.g., polyvinylchloride and polyimide film).

Example 18

Comparative Sample

A sample of Ultem® 2300 polyetherimide was pretreated using the components described in the claims of U.S. Pat. No. 4,959,121 without further executed pretreatment operations. The sample was treated with 13.0 M/L nitric acid for 10 minutes at ambient temperature, washed with water of ambient temperature for 1 minute, and then treated with 16.9 M/L sulfuric acid for 4 minutes at ambient temperature. After pretreatment, the sample was washed with water for 1 minute at ambient temperature and plated with a nickel layer using either 1) electroless nickel plating technique or 2) by direct plating using electrolytic nickel. The adhesion strength was tested as described above. The treatments were performed at ambient pressure and humidity. The results are shown in Table 1.

Comparable Example 18 in Table 1 shows that treatment with concentrated sulfuric acid alone (which is identical to the process according to the claims in U.S. Pat. No. 4,959,121) can yield an adhesion value of only 0.1 N/mm without further executed pretreatment operations described in the patent, such as dipping the treated polyimide into strongly alkaline solution of sodium hydroxide and finalizing the pre-treatment by contacting the polyimide with the alkaline permanganate solution. This data demonstrates that periodate ions in the second composition containing concentrated $H_2SO_4$ of the chrome-free pretreatment provided herein create very effective adhesion groups on the surface of Ultem® 2300 polyetherimide.

Examples 19 and 20

Chromic Acid Comparative Sample

Ultem® 2300 polyetherimide samples were adhesionally pretreated using conventional chromic acid etching solution consisting of 4 M/L of chromium trioxide ($CrO_3$) and 3.6 M/L sulfuric acid ($H_2SO_4$), at 80° C. for 5-20 minutes as a control, then subjected to nickel plating as described above. The treatments were performed at ambient pressure and humidity. The adhesion strength was tested as described above. The results are shown in Table 2.

TABLE 2

Adhesion Measurements - Using Chromic Acid Pretreatment

| Ex. #. | Plastic | Concentration of $H_2SO_4$, M/L | Concentration of $CrO_3$, M/L | Treatment Time, Min. | Ni layer adhesion to Plastic, N/mm |
|---|---|---|---|---|---|
| 19 | Ultem 2300 | 3.6 | 4.0 | 5 | 0.8 |
| 20 | Ultem 2300 | 3.6 | 4.0 | 20 | 0.9 |

The highest adhesional value achieved for Ultem® 2300 polyetherimide using conventional pretreatment based on treatment with chromic acid was 0.9 N/mm or less.

Examples 21-27

Preparation of Metallized Plastic Surfaces—One-Step Pretreatment Process

Pieces of Ultem® 2300 polyetherimide were pretreated using the one-step solution process described herein. The concentrations of the components in the activation composition and the treatment times are shown in Table 3.

TABLE 3

Adhesion Measurements - Using One Step Pretreatment

| | One-Treatment Solution Composition | | | Treatment | Ni layer |
|---|---|---|---|---|---|
| Ex. #. | Concentration of $H_2SO_4$, M/L | Concentration of $HNO_3$, M/L | Concentration of $NaIO_4$, M/L | Time, min. | adhesion to Plastic, N/mm |
| 21 | 16.9 | 0.130 | 0.10 | 4 | 1.5 |
| 22 | 15.4 | 0.130 | 0.10 | 4 | 0.9 |
| 23 | 16.9 | 0.013 | 0.10 | 4 | 1.3 |
| 24 | 16.9 | 0.130 | 0.01 | 4 | 0.8 |
| 25 | 16.9 | 0.130 | 0.10 | 8 | 1.5 |
| 26 | 17.5 | 0.130 | 0.10 | 4 | 0.1 (Note) |
| 27 | 16.9 | 0.130 | 0.10 | 1 | 1.0 |

(Note): Plastic surface destroyed.

Each of the Ultem® 2300 polyetherimide substrates was treated with a combined composition, which contained sulfuric acid present in an amount of from at or about 15.4 M/L to at or about 17.5 M/L, nitric acid in an amount of from at or about 0.013 M/L to at or about 0.130 M/L, and sodium periodate at a concentration of at or about 0.01 to at or about 0.1 M/L, by immersing the plastic substrate in the activation composition at ambient temperature for a treatment time of between 1 and 8 minutes. After the treatment time concluded, the plastic substrate washed with ambient temperature water for 1 minute and dried using compressed oil-free dry air. After pretreatment, the samples were subsequently plated with a nickel layer using either: 1) an electroless nickel plating technique or 2) by direct plating using electrolytic nickel, as described above. The treatments were performed at ambient pressure and humidity.

The data show that for Ultem® 2300 polyetherimide, the best adhesion values are achieved when the range of nitric acid concentrations in the one-step pretreatment process is between at or about 0.013 M/L to at or about 0.130 M/L (e.g., see Table 3, Examples 21 and 23).

The data demonstrate that periodate ions in concentrated $H_2SO_4$ create very effective adhesion groups on the surface of Ultem® 2300 polyetherimide.

As shown in Table 3, the adhesion values for metallized Ultem® 2300 polyetherimide treated using the one-step pretreatment (e.g., see Table 3, Examples 21 and 25) are considerably higher (1.5 N/mm) than those for the same Ultem® 2300 polyetherimide treated conventionally (e.g., see Table 2, Example 20, 0.9 N/mm). The results of the highest adhesion values recorded in Table 3 demonstrate that the optimal $H_2SO_4$ concentration is between 15.4 M/L and 17.5 M/L independently if the pretreatment is two-step (Table 1, Examples 1-8, 14) or is one-step (Table 3, Examples 21 and 23-35). When reacting with the Ultem® 2300 polyetherimide, modulating the concentration of sulfuric acid has a significant effect on adhesion: too low a concentration does not promote periodate ion activity (e.g., see Table 3, Example 22), and too high a concentration causes the surface of the Ultem® 2300 polyetherimide plastic to be degraded resulting in lower adhesion values (Table 3, Example 26). Independently of whether the two-step pretreatment or one-step pretreatment is used, the adhesion values for Ultem® 2300 polyetherimide sharply decrease if the concentration of sulfuric acid in the periodate-ion-containing solution is not near about 16.9 M/L.

As the data show, adding periodate ions to sulfuric acid enhances the adhesion of a metal coating to the treated plastic surface. Example No. 13 in Table 1 and Example No. 24 in Table 3 demonstrate that the adhesion values achieved are lower if the concentration of periodate ions in the second composition (containing $H_2SO_4$) is too low. When the substrate has a surface of Ultem® 2300 polyetherimide plastic, the minimum concentration of periodate ions necessary to achieve an adhesion of at least 1.5 N/mm is a periodate ion concentration of about 0.03 M/L. The data demonstrate that the pretreatment processes provided herein, which include periodate ions in $H_2SO_4$, result in the creation of very effective adhesion groups on the surface of Ultem® 2300 polyetherimide plastic.

As can be seen from the data, for the one-step process, a 1 minute exposure of the surface to the combined composition is not sufficient to achieve the highest adhesion values for of Ultem® 2300 polyetherimide plastic, while a 4 minute exposure of the surface to the combined composition is sufficient to achieve very high adhesion values (e.g., compare Examples No. 21, 25, and 27 in Table 3).

While various embodiments of the subject matter provided herein have been described, it should be understood that they have been presented by way of example only, and not limitation. Since modifications will be apparent to those of skill in this art, it is intended that this invention be limited only by the scope of the appended claims.

The invention claimed is:
1. A method of pretreating a 30% glass fibers filled polyetherimide substrate for metallization, the method comprising:
    contacting a surface of the substrate for 10 minutes to 30 minutes with a first composition comprising nitric acid at a concentration of 10.4 Moles/L (M/L) to 13.0 M/L to form a first treated surface; and
    contacting the first treated surface for 4 minutes with a second composition comprising sulfuric acid at a concentration of 16.9 M/L, and periodate ions at a concentration of 0.2 M/L, to produce an adherent surface on the substrate for metallization;
    wherein the method is free of chromium ions;
    the method is free of a mechanical abrasion step; and
    the adherent surface upon metallization exhibits an adhesion of metal of 1.5 N/mm or greater when measured according to ASTM International Test Method B533-85 (2013).
2. The method of claim 1, wherein the contacting steps are performed by dipping, spraying, rolling, brushing, dripping, pouring, or curtain coating, or any combination thereof.
3. The method of claim 1, which enhances and promotes the adhesion of a metal coating to the surface when compared to the adhesion achieved when the substrate is pretreated with chromic acid using or not using a mechanical abrasion before pretreatment.
4. The method of claim 1, further comprising plating the adherent surface with a metallic coating.
5. The method of claim 4, wherein the plating is performed by electroless plating, autocatalytic plating, direct electroplating, immersion plating, sputtering, thermal spraying, metal vapor deposition or by any two or more of these techniques.
6. The method of claim 1, wherein the periodate ion comprises periodic acid, sodium periodate, potassium periodate, or a combination of any two or more thereof.
7. The method of claim 1, wherein the method comprises
    contacting the surface of the substrate for 10 minutes with the first composition to form the first treated surface; and
    contacting the first treated surface for 4 minutes with the second composition to produce the adherent surface on the substrate for metallization.
8. The method of claim 1, wherein the method comprises
    contacting the surface of the substrate for 10 minutes with the first composition comprising nitric acid at a concentration of 13.0 M/L to form the first treated surface; and
    contacting the first treated surface for 4 minutes with the second composition to produce the adherent surface on the substrate for metallization.
9. A method of metallizing a surface of a plastic or polymer article, the method comprising:
    (a) pretreating the surface of the plastic or polymer article to yield an adherent surface;
    (b) activating the adherent surface by applying an electroconductive layer; and
    (c) applying a metal coating to yield a metallized surface exhibiting an adhesion of metal of 1.5 N/mm or greater when measured according to ASTM International Test Method B533-85 (2013);
    wherein, the method is free of chromium ions, the surface of the plastic or polymer article is
    30% glass fibers filled polyetherimide, and the pretreating comprises:
    contacting the surface of the plastic or polymer article for 10 minutes to 30 minutes with a first composition comprising nitric acid at a concentration of 10.4 Moles/L (M/L) to 13.0 M/L to form a first treated surface; and contacting the first treated surface for 4 minutes with a second composition comprising sulfuric acid at a concentration of 16.9 M/L, and periodate ions at a concentration of 0.2 M/L, to produce the adherent surface.

10. The method of claim 9, wherein the electroconductive layer is applied by electroless nickel or copper plating, by applying an electroconductive polymer, by applying an electroconductive salt, or by applying a dispersion of electroconductive particles.

11. The method of claim 10, wherein the dispersion of electroconductive particles comprises particles of a material selected from among carbon, graphite, metal and a metal salt and combinations thereof.

12. The method of claim 11, wherein the metal is selected from the group consisting of silver, copper, nickel, cobalt, and palladium.

13. The method of claim 9, wherein activating the adherent surface comprises applying particles of gold, iridium, silver, osmium, palladium, platinum, rhodium, ruthenium, copper, cobalt, nickel, or a mixture of any two or more thereof before electrolytic or electroless nickel or copper plating.

14. The method of claim 9, wherein the metal coating is applied by electroless plating, autocatalytic plating, direct electroplating, sputtering, thermal spraying, metal vapor deposition or by any two or more of these techniques.

15. The method of claim 9, further comprising exposing the metallic coating to a finishing treatment.

16. The method of claim 15, wherein the finishing treatment is selected from the group consisting of plating with a metal, polishing, chromating, phosphating, applying a top coating and combinations thereof.

17. The method of claim 9, wherein the method comprises
contacting the surface of the substrate for 10 minutes with the first composition to form the first treated surface; and
contacting the first treated surface for 4 minutes with the second composition to produce the adherent surface on the substrate for metallization.

18. The method of claim 9, wherein the method comprises
contacting the surface of the substrate for 10 minutes with the first composition comprising nitric acid at a concentration of 13.0 M/L to form the first treated surface; and
contacting the first treated surface for 4 minutes with the second composition to produce the adherent surface on the substrate for metallization.

* * * * *